(12) United States Patent
Jurrissen et al.

(10) Patent No.: US 8,502,535 B2
(45) Date of Patent: Aug. 6, 2013

(54) COIL SELECTION FOR PARALLEL MAGNETIC RESONANCE IMAGING

(75) Inventors: Michel Paul Jurriaan Jurrissen, Eindhoven (NL); Peter Boernert, Hamburg (DE); Mariya Ivanova Doneva, Hamburg (DE); Miha Federer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 403 days.

(21) Appl. No.: 12/920,118

(22) PCT Filed: Mar. 6, 2009

(86) PCT No.: PCT/IB2009/050925
§ 371 (c)(1),
(2), (4) Date: Aug. 30, 2010

(87) PCT Pub. No.: WO2009/112987
PCT Pub. Date: Sep. 17, 2009

(65) Prior Publication Data
US 2011/0006766 A1 Jan. 13, 2011

(30) Foreign Application Priority Data
Mar. 14, 2008 (EP) .................. 08152772

(51) Int. Cl.
*G01V 3/00* (2006.01)
(52) U.S. Cl.
USPC .......................... 324/309; 324/307

(58) Field of Classification Search
USPC .................. 324/309, 307, 318, 322
See application file for complete search history.

(56) References Cited

U.S. PATENT DOCUMENTS

| | | | |
|---|---|---|---|
| 5,138,260 A | 8/1992 | Molyneaux et al. | |
| 7,095,229 B2 | 8/2006 | Lorenz | |
| 7,279,893 B1 | 10/2007 | Marinelli et al. | |
| 7,576,536 B2 * | 8/2009 | Akao et al. .................... | 324/307 |
| 8,076,938 B2 * | 12/2011 | Brau et al. .................... | 324/309 |
| 8,085,046 B2 * | 12/2011 | Zelinski et al. ............... | 324/309 |
| 2002/0186870 A1 | 12/2002 | Ma et al. | |
| 2006/0152220 A1 | 7/2006 | Nabetani et al. | |
| 2006/0208731 A1 | 9/2006 | Wang et al. | |
| 2007/0013375 A1 | 1/2007 | Akao et al. | |
| 2007/0069727 A1 | 3/2007 | Schulz et al. | |
| 2007/0210793 A1 | 9/2007 | Kiefer | |

OTHER PUBLICATIONS

By Niendorf et al: "Toward Single Breath-Hold Whole-Heart Coverage Coronary MRA Using Highly Accelerated Parallel Imaging With a 32-Channel MR System" Magnetic Resonance in Medicine, Academic Press, Duluth, MN, US, vol. 56, No. 1, Jan. 1, 2006, pp. 167-176, XP007908557 ISSN: 0740-3194 [retrieved on Jun. 5, 2006] cited in the application the whole document.
By K. P. Pruessmann et al: "Sense: Sensitivity Encoding for Fast MRI" Magnetic Resonance in Medicine, Academic Press, Duluth, MN, US, vol. 42, No. 5, Nov. 1, 1999, pp. 952-962, XP000866655 ISSN: 0740-3194 the whole document.

(Continued)

Primary Examiner — Louis Arana (57) ABSTRACT

The invention relates to a method of selecting a set of coil elements from a multitude of physical coil elements comprised in a coil array for performing a magnetic resonance imaging scan of a region of interest.

11 Claims, 4 Drawing Sheets

OTHER PUBLICATIONS

By Mariya Doneva et al: "Automatic Coil Selection for Channel Reduction in Sense-Based Parallel Imaging" Magnetic Resonance Materials in Physics, Biology and Medicine, Chapman and Hall, London, GB, vol. 21, No. 3, Apr. 3, 2008, pp. 187-196, XP019596838 ISSN: 1352-8661 the whole document.

By Martin Buehrer et al: "Array Compression for MRI With Large Coil Arrays" Magnetic Resonance in Medicine, Academic Press, Duluth, MN, US, vol. 57, No. 6, Jun. 1, 2007, pp. 1131-1139, XP007908560 ISSN: 0740-3194 the whole document pp. 1-11.

* cited by examiner

COIL SELECTION FOR PARALLEL MAGNETIC RESONANCE IMAGING

TECHNICAL FIELD

The invention relates to a method of selecting a set of coil elements from a multitude of physical coil elements comprised in a coil array for performing a magnetic resonance imaging scan, a computer program product and a magnetic resonance imaging system.

BACKGROUND AND RELATED ART

Parallel imaging using coil arrays with a large number of independent coil elements provides improved imaging performance and increased signal to noise ratio. Today, there is a fundamental trend to considerably increase the number of coil elements used for reception. Recently, 32-element coils have been introduced to boost SNR and to allow for higher reduction factors (Niendorf T., Hardy C. J., Giaquinto R. O., Gross P., Cline H. E., Zhu Y., Kenwood G., Cohen S., Grant A. K., Joshi S., Rofsky N. M., Sodickson D. K. (2006) Toward single breath-hold whole-heart coverage coronary MRA using highly accelerated parallel imaging with a 32-channel MR system. Magn Reson Med 56: 167-176).

Even more complex coil arrays have been proposed and realized, consisting of up to 128 individual elements. However, a number of these coil arrays have been used on systems supporting only 32 receive channels. The use of a large number of coil array elements can lead to memory storage problems and to increased reconstruction times.

To overcome these problems, data reduction techniques could be applied. These can be realized by a linear combination of the original coil data prior to reception, using an appropriate hardware combiner, data compression of the sample data before reconstruction, or by discarding particular data from coil elements with low signal content (either before or after reception).

U.S. Pat. No. 7,279,893 discloses an image reconstruction technique which determines linear combinations of receiver channel information that contribute the most to image SNR to reduce the computational burden placed on the reconstruction engine of an MRI system and which quantifies the SNR loss for the reduced receiver channel set for image reconstruction.

It is a goal of the invention to provide an improved method of selecting a set of coil elements from a multitude of physical coil elements comprised in a coil array for performing a magnetic resonance imaging scan, an improved computer program product and an improved magnetic resonance imaging system

SUMMARY OF THE INVENTION

The present invention provides a method of selecting a set of coil elements from a multitude of physical coil elements comprised in a coil array for performing a magnetic resonance imaging scan optimized for a region of interest, the method comprising determining a coil sensitivity matrix of the multitude of physical coil elements for the region of interest and determining a projection matrix, the projection matrix projecting the sensitivity matrix of the multitude of physical coil elements onto a set of virtual coil elements. Subsequently, the contribution of each physical coil element of the multitude of physical coil elements to the set of virtual coil elements is determined from the projection matrix. Then, from this contribution the most significantly contributing physical coil elements are selected as the set of coil elements.

The method according to the invention has the advantage, that in principle all possible subsets of coil element combinations are considered in order to select the most suitable set of coil elements for performing a magnetic resonance imaging scan of the region of interest. An exhaustive search through all possible subsets is not required since a SENSE (sensitivity encoding) reconstruction approach with Cartesian k-space sampling is performed and the projection matrix approach yields a recommendation for the optimal coil set to be used, which does not require a search for the most appropriate set of coil elements on a coil element by coil element basis.

The method according to the invention allows for an automatic coil selection, i.e. selecting only the important coils for signal sampling, which reduces the load on memory and reconstruction. The algorithm underlying the method allows selecting corresponding coils automatically without any user interaction facilitating optimal selection for SENSE type imaging. The algorithm is important for optimal workflow and applicable already during the scan planning phase selecting the best coil element automatically. Furthermore, it can be used during real-time interactive scanning, coping with changed scan conditions, maintaining the best system performance to optimal real time coil selection.

In accordance with an embodiment of the invention, the projection matrix is determined by a factorization of the coil sensitivity matrix. Preferably, the factorization is performed by singular value decomposition (SVD). SVD has the advantage that in a fast manner a matrix can be factorized exactly in such a way that one of the factors corresponds to a matrix from which the projection matrix can be mathematically deduced with low computational effort.

In accordance with an embodiment of the invention, the contribution of the physical coil element is determined by calculating the total of all projection matrix element magnitudes receiving a contribution from the physical coil element. This has the advantage that instead of considering the effect of an individual physical coil element onto a received signal the total effect is considered which results from a combined effect of all physical coil elements. The combinatory effect of all physical coil elements contributing to a local signal corresponds to the real case when data acquisition is performed using multicoil techniques.

In accordance with an embodiment of the invention, the contribution of the physical coil element is the averaged contribution of said physical coil element to all voxels in the region of interest.

In accordance with a further embodiment of the invention, the method further comprises determining a noise correlation matrix of the multitude of physical coil elements, wherein the projection matrix is determined from the coil sensitivity matrix and the noise correlation matrix.

Alternatively, in a further embodiment of the invention the method further comprises determining additional contributions of each physical coil element of the multitude of physical coil elements to the set of virtual coil elements using the noise correlation matrix, wherein the selection of the most significantly contributing physical coil elements as the set of coil elements further comprises weighting the contribution of each physical coil element according to the additional contributions derived from the noise correlation matrix.

Further including the noise correlation matrix into the determination procedure which set of coils to select has the advantage, that couplings between coil elements are considered. This further increases the accuracy of the method according to the invention thus reflecting more precisely the physical conditions in a real MRI system.

In accordance with an embodiment of the invention, the additional contributions derived from the noise correlation matrix are calculated by means of a further projection matrix, wherein the further projection matrix is determined by factorization of the noise correlation matrix. This has the same advantage as already discussed above with respect to the coil sensitivity matrix, namely a quick coil selection with low computational burden and high accuracy.

In accordance with a further embodiment of the invention, the coil sensitivity matrix is a reception coil sensitivity matrix or a transmission coil sensitivity matrix. In other words it is possible to apply the method according to the invention for transmission as well as for reception purposes. In both cases, the most appropriate set of coils out of a multitude of transmission or reception coils can be used to excite and/or refocus magnetization or to acquire data from a region of interest. Thus, the idea of using parallel imaging to shorten the acquisition time by the simultaneous use of multiple receive coils can be adapted for the parallel transmission of spatially selective multi-dimensional RF pulses by using only the relevant transmit coils in a given experiment. In this way optimal transmission with a limited set of transmitters and/or RF amplifies can be realized or the dimensionality of the RF pulse design problem can be reduced, by skipping the RF pulse calculation for transmit elements which do not significantly contribute to the final result. The latter may result in faster calculation times due to the reduced problem size.

In another aspect, the invention relates to a computer program product comprising computer executable instructions to perform the method according to the invention.

In another aspect, the invention relates to a magnetic resonance imaging system, the system comprising a coil array adapted for performing a magnetic resonance imaging scan of a region of interest, wherein the coil array comprises a multitude of physical coil elements, the system comprising means for determining a coil sensitivity matrix of the multitude of physical coil elements for the region of interest, means for determining a projection matrix, the projection matrix projecting the sensitivity matrix of the multitude of physical coil elements onto a set of virtual coil elements, means for determining from the projection matrix the contribution of each physical coil element of the multitude of physical coil elements to the set of virtual coil elements and means for selecting from the contribution the most significantly contributing physical coil element as a set of coil elements applicable for performing a magnetic resonance imaging scan of the region of interest.

In accordance with an embodiment of the invention, the magnetic resonance imaging scan further comprises means for factorization of the coil sensitivity matrix, for example by singular value decomposition. Further, in a preferred embodiment of the invention the magnetic resonance imaging system further comprises means for determining a noise correlation matrix of the multitude of physical coil elements, wherein the means for determining the projection matrix are adapted to determine the projection matrix from the coil sensitivity matrix and the noise correlation matrix.

In accordance with an embodiment of the invention, the magnetic resonance imaging system further comprises means for determining additional contributions for each physical coil element of the multitude of physical coil elements for the set of virtual coil elements using the noise correlation matrix.

In another aspect, the invention relates to a method of selecting a set of coil elements from a multitude of physical coil elements comprised in a coil array for performing a magnetic resonance imaging scan of a region of interest, wherein each physical coil element of the set of coil elements exhibits a coil sensitivity, wherein the method comprises determining a first estimated information content for the image resulting from magnetic resonance imaging scan of the region of interest, wherein the determination of that image is performed by combining the coil sensitivities of a first set of the physical coil elements. The method further comprises determining a second estimated information content for the image resulting from a magnetic resonance imaging scan of the region of interest, wherein the determination is performed by combining the coil sensitivities of a second set of the physical coil elements, wherein in the second set of the physical coil elements at least one coil is skipped compared to the first set of physical coil elements. Further, the loss of information resulting from skipping the at least one coil is calculated by comparing the first and second information content. Finally, the previous steps are repeated and the set of coil elements is determined which yields the minimum loss of information.

The "information content" can be understood as the number of bits required to represent the relevant information of the image. More precisely, the "information content" of an MR image is regarded here as the sum of the information-contents (or "mutual information") of each pixel. In this context, "mutual information" measures the amount of information that can be obtained about the tissue at a given location of the object, by observing a noisy reconstruction thereof. It can be expressed as $$I(X;Y)=H(X)-H(X|Y)$$

where I stands for mutual information, H for entropy, X for the true state of the tissue (in this context: the noiseless signal) and Y the reconstructed noisy signal. In essence, H(X) is the entropy of the signal and H(X|Y) is the entropy of the noise.

In another aspect, the invention relates to a computer program product comprising computer executable instructions to perform said method of selecting a set of coil elements based on the information content analysis disclosed above.

In yet another aspect the invention relates to a magnetic resonance imaging system, the system comprising a coil array adapted for performing a magnetic resonance imaging scan of a region of interest, wherein the coil array comprises a multitude of physical coil elements, the system comprising means for determining a first estimated information content for an image resulting from the magnetic resonance imaging scan of a region of interest, wherein the determination is performed by combining coil sensitivities of a first set of the physical coil elements. The system further comprises means for determining a second estimated information content for an image resulting from the magnetic resonance imaging scan of the region of interest, wherein the determination is performed by combining the coil sensitivities of a second set of the physical coil elements, wherein in the second set of the physical coil elements at least one coil is skipped compared to the first set of physical coil elements. The system further comprises means for calculating the loss of information resulting from skipping the at least one coil by comparing the first and second information content and means for repeating said steps and determining the set of coil elements yielding the minimum loss of information.

BRIEF DESCRIPTION OF THE DRAWINGS

In the following preferred embodiments of the invention are described in greater detail by way of example only making reference to the drawings in which.

DETAILED DESCRIPTION

Figure 1:
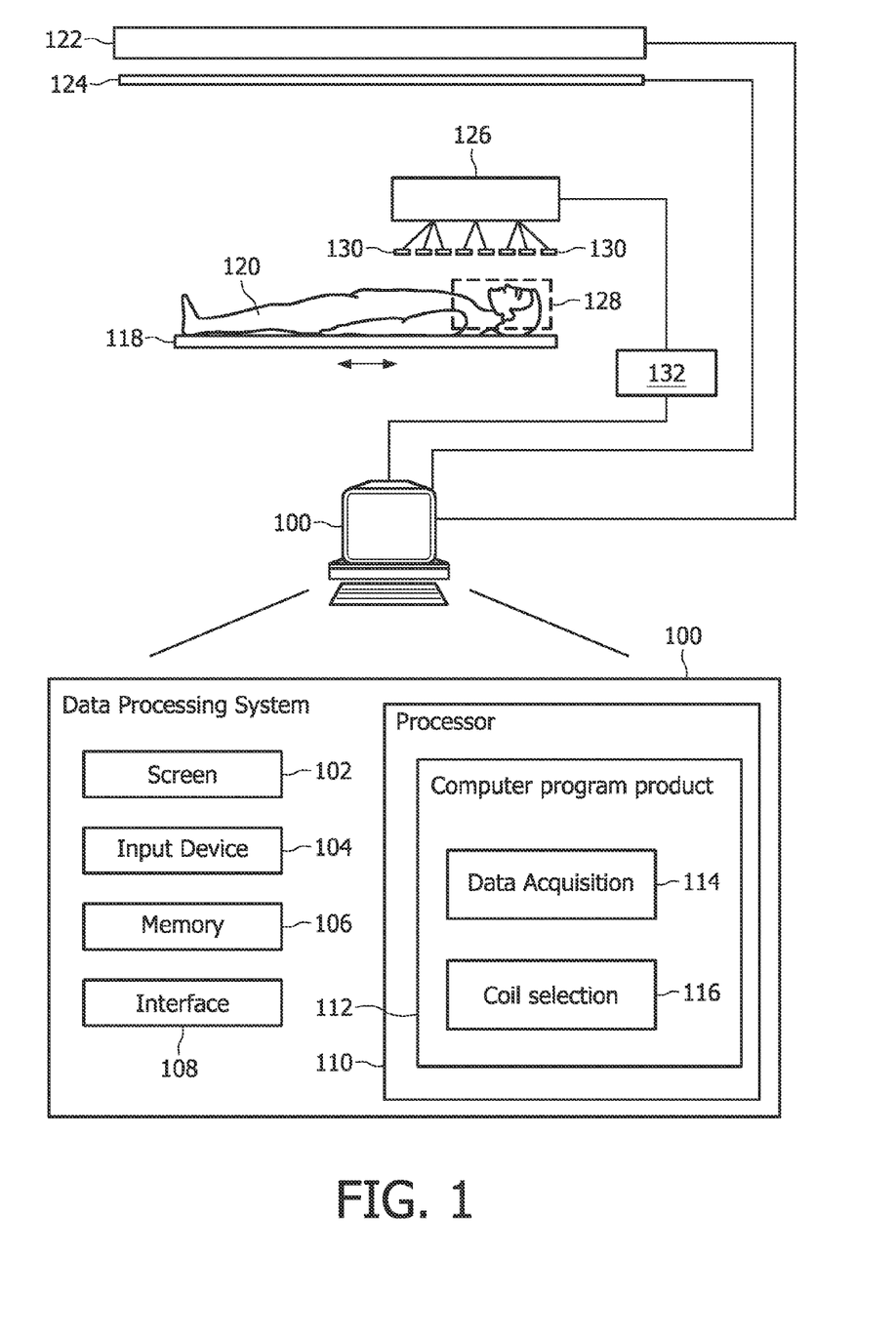
FIG. 1 is a schematic illustrating an MRI system according to the invention.

FIG. 1 is a schematic illustrating an MRI system according to the invention. Only major components of a preferred MRI system which incorporate the present invention are shown in FIG. 1. The magnetic resonance imaging apparatus comprises a data processing system 100, wherein the data processing system 100 typically comprises a computer screen 102 and an input device 104. Such an input device could be for example a keyboard or a mouse.

The MRI system in FIG. 1 further comprises a memory 106 and an interface 108. The interface 108 is adapted for communication and data exchange with typical hardware MRI components.

Typical hardware MRI components are for example a magnet 122 which generates a main magnetic field for performing a magnetic resonance imaging scan of an object 120, like for example a person. Further, gradient coils 124 are controlled by the data processing system 100, wherein the gradient coils are necessary and used for performing a 3-dimensional data acquisition. The gradient coils 124 are preferably self-shielded gradient coils for producing gradients along three mutual axis x, y and z.

The object or person 120 is located on a table 118 which is movable with respect to a set of RF coils 130. The set of RF coils 130 is connected to a control unit 126 which is adapted for selecting a subset of coils 130 from the multitude of the coils shown in FIG. 1 and to map them to the limited number of RF channels. For example, the MRI system of FIG. 1 may exemplary have only a set of four MR receiver channels, located in the receiver/transmitter unit 132, wherein a total of eight reception coils 130 are available. Thus, a coil element selection has to be performed which refers to dimensionality reduction, in which an optimal subset of physical coils is selected for image reconstruction.

The selection is performed by the data processing system 100 which further comprises a processor which is adapted to execute computer executable instructions of the computer program product 112. In the present embodiment, the data processing system 100 comprises a computer program product 112 by means of a data acquisition module 114 which is adapted to control hardware units 122, 124, 126 and 132. Also, the movement of the table 118 can be controlled by the data acquisition module 114. Further, the computer program product 112 comprises a coil selection module 116. Based on the information received for example during a pre-scan procedure from the set of coils 130 the coil selection module 116 performs a selection which physical coils to use for performing a data acquisition of the region of interest 128.

As can be clearly seen in the example of FIG. 1, due to the relative position of the region of interest 128 and the set of coils 130 it would be appropriate to only select a subset of coils 130 for data acquisition which is located in close vicinity to said region of interest 128. Such a pre-selection can be already made without analyzing any reception signals from the coils 130 by just comparing the well known spatial positions of the coils 130 with respect to the actual position of the table 118. If for example a head examination of a person has to be performed the data processing system 100 always knows that in the example of FIG. 1 only the very right arranged set of coils will be required for performing a respective MR scan. By pre-selecting a set of coils the computational burden for calculating an appropriate set of coils for performing an MR scan of the region of interest can be reduced since for the calculation procedure not all coils have to be taken into account.

A similar procedure can also be performed to select a limited number of channels for transmission. In analogy the data processing system 100 and the corresponding software selects the corresponding transmit coils which are driven by the transmitter unit 132, which contains schematically the corresponding RF amplifiers.

Figure 2:
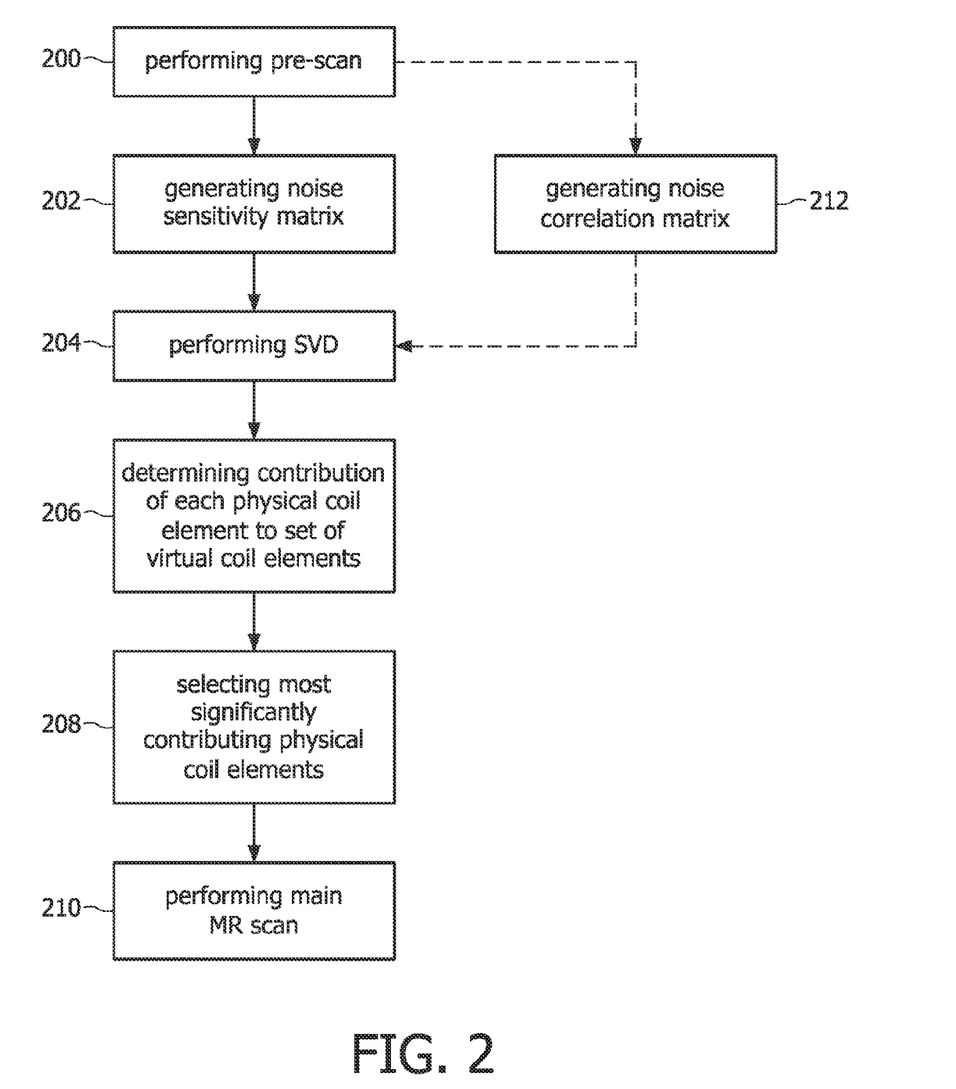
FIG. 2 is a flowchart illustrating the method of selecting a set of coil elements from a multitude of physical coil elements comprised in a coil array for performing a magnetic resonance imaging scan of a region of interest.

Referring to FIG. 2, for selecting a set of coil elements for performing an MR scan of a region of interest, the steps depicted in FIG. 2 are carried out. In step 200, a pre-scan is performed which is followed by step 202, the generation of a coil sensitivity matrix of the multitude of physical coil elements based on the pre-scan data. By performing a singular value decomposition in step 204, a projection matrix is determined, the projection matrix projecting the sensitivity matrix of the multitude of physical coil elements onto a set of virtual coil elements. This is followed by step 206, in which from the projection matrix the contribution of each physical coil element of the multitude of physical coil elements to the set of virtual coil elements is determined. In step 208, from the contribution the most significantly contributing physical coil elements are selected as the set of coil elements which is used in step 210 in order to perform a main magnetic resonance scan.

For more accurate results, a noise correlation matrix which also can be obtained by performing the pre-scan in step 200 can be considered. In one alternative embodiment, in step 212 a noise correlation matrix is generated after having performed the pre-scanning step 200. The noise correlation matrix generated in step 212 is thereupon used in step 204 for performing the singular value decomposition on the coil sensitivity matrix and the noise correlation matrix in order to determine the projection matrix.

In the following, a detailed theoretical outline of the singular value decomposition based coil selection shall be given:

SENSE reconstruction of uniformly undersampled Cartesian data consists of solving a linear system of L equations with R variables, where L is the number of coil elements, and R is the reduction factor. The R unknowns could be uniquely determined if they were measured with a basis of R orthogonal coils. Solving this system of equations could be presented as projecting the problem from the L to the R dimensional space and then solving it in the lower dimensional space.

Consider a SENSE reconstruction problem with Cartesian k-space sampling at a reduction factor R in an arbitrary direction [3] using an L-element coil array. The reconstruction problem at each pixel is given by:

$$a = Sb + n \quad (1)$$

The vector a consists of the complex pixel intensities in the reduced field of view (FOV) images for each coil, S is the L×R sensitivity matrix, b is a vector containing the original image pixels, which are superimposed in the aliased images, and n is a noise vector. The reconstruction consists of solving the linear system of Eqs. (1) for each aliased pixel in the reduced FOV. This system is overdetermined, thus an estimation technique has to be used for finding the solution. Assuming Gaussian statistics for the noise, the best linear unbiased estimator of vector b is given by:

$$b = (S^H \psi^{-1} S)^{-1} S^H \psi^{-1} a, \quad (2)$$

where $\Psi$ is the L×L receiver noise covariance matrix, which helps to optimize SNR during the reconstruction. The noise covariance matrix may be replaced by an identity matrix, leading to the least squares estimator for b. In this case, the unfolding is still ensured, yet at an SNR penalty, which will be the more significant, the less equivalent the receivers are with respect to load, gain, and mutual coupling.

Alternatively, matrix factorization techniques might be used to obtain the linear least squares solution in a numerically stable fashion. The most common matrix factorization technique used for solving an overdetermined system of linear equations is the singular value decomposition (SVD).

Using SVD, the sensitivity matrix S can be factorized as $S=U\Sigma V^H$, and the SVD solution of (1) is given by:

$$b = V\Sigma^+ U^H a, \quad (3)$$

where $\Sigma^+$ is the transposed of $\Sigma$ with every value, greater than a preset threshold, replaced with its reciprocal.

Eq. (3) can be written in the form:

$$U^H a = U^H S b = \Sigma V^H b \quad (4)$$

considering only the rows of $U^H$, $\Sigma$, and V corresponding to singular values greater than the threshold. The matrix $U^H$ projects both the data and the sensitivity matrix into lower dimensional space, corresponding to the rank of the matrix S. Let us denote this projection of the coil sensitivity matrix with S', the corresponding projection of the data vector with a0 and the projection matrix, which transforms S to S' with P, where $P = U^H$.

$$a' = U^H a = Pa$$

$$S' = U^H S = PS \quad (5)$$

The rows of the new sensitivity matrix S' can be considered as sensitivities of a set of virtual coils, which sensitivity vectors are obtained as a superposition of the real physical coil sensitivities. The coils can be ranked according to their relative contribution to the virtual coils. The i-th row vector of S' can be written as a linear combination of the rows of S $$s'_i = \sum_k p_{ik} s_k \quad (6)$$

where the weighting factors $P(i,k) = p_{ik}$ ($k=1, \ldots, n_c$) are the i-th row entries of matrix P. The magnitude of $p_{ik}$ represents the contribution of the k-th physical coil to the i-th virtual coil. In this way, the coil array elements can be ranked according to the weighting function:

$$w_k = \sum_i |p_{ik}| \quad (7)$$

The weighting function can be calculated for each reconstructed pixel in the full FOV (field of view) image or for a given region of interest, and the optimal coil set is chosen according to the total weight for this region.

$$W_k = \frac{\sum_{r \in ROI} w_k(r)}{N_{ROI}} \quad (8)$$

In this way, a single step coil selection is performed using the singular value decomposition of the sensitivity matrix.

Figure 3:
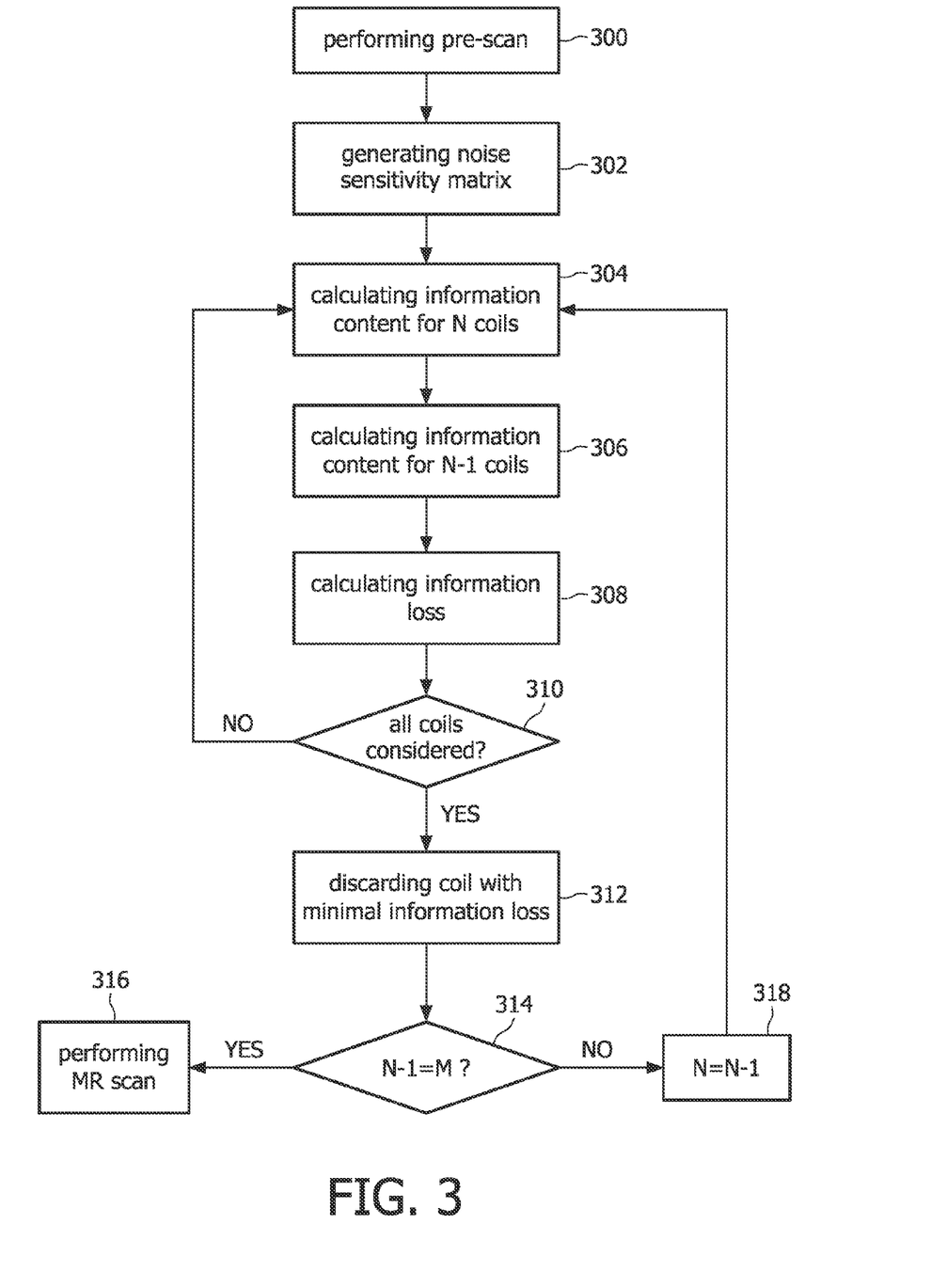
FIG. 3 is a further flowchart illustrating a method of selecting a set of coil elements from a multitude of physical coil elements.

FIG. 3 illustrates a further flowchart of a further method of selecting a set of coil elements from a multitude of physical coil elements comprised in the coil array for performing a magnetic resonance imaging scan. The method starts with step 300, performing a pre-scan in order to obtain data for generating a noise sensitivity matrix in step 302. From said noise sensitivity matrix the 'information content' can be calculated in step 304 for N coils. This is followed by step 306 wherein the information content is calculated for N−1 coils. The difference between the calculated information content for N coils and the calculated information content for N−1 coils is the information loss which is experienced when discarding said one coil. This information loss is calculated in step 308. Step 304-308 are repeated until in step 310 it is decided that information loss is calculated for all possible coil combinations and skipped coils. In case in step 310 all coils have been considered, in step 312 the coil with minimal information loss is discarded.

In step 314 it is checked whether disregarding the coil will result in a number of physical coils which corresponds to a predetermined number of coils M which is desired to use to perform a final MR scan. If in step 314 there are still too many coils, i.e. N−1>M, in step 318 N=N−1 is calculated, followed by a repetition of the steps 304-314. Each of said cycle reduces the number of coil elements by 1, until in step 314 the number of elements is reduced to M. Thereafter, in step 316 an MR scan is performed with said number of physical coil elements, the other coil elements being discarded due to the minimal information loss linked with discarding these coil elements.

In the following, this coil element selection method shall be described in more detail:

Assume we have $N_{acq}$ acquired channels (coil elements), which need to be reduced to $N_{rec}$ elements, due to reconstruction performance and/or memory limitations. This reduction from $N_{acq}$ to $N_{rec}$ elements can be established by performing fast channel combinations (pre-combination) of profiles in time domain or by skipping channels.

To determine the optimal channel reduction, first an estimation must be made of the expected SNR from each channel, let this be $p_i(x)$. Here is x a vector in the 3-dimensional volume of the scan. This $p_i$ can be estimated from a coil survey scan preparation scan. This is a scan with the same geometry as the actual scan, with large voxels (about 20 mm) and a scan time of about 1 second. This coil survey scan can be used to make a coarse estimate of the spatial SNR distribution. These coarse SNR distributions per coil i ($pc_i(x)$) are normalized according to:

$$\frac{1}{N_x} \sum_x \sum_i^{Nacq} pc_i^2(x) = 1$$

The summation over x is a summation over all voxels in the coil survey scan. The 'average SNR' is different per scan protocol, $F_{SNR}(scan)$. This could be determined per scan, or a constant value of 50 may be sufficient. Now the expected SNR $p_i(x)$ per coil-element i is $$p_i(x) = F_{SNR}(scan) \cdot pc_i(x)$$

After combination of all channels an estimation of the SNR of the resulting image is given by $$q_{Nacq}(x) = \sqrt{\sum_i^{Nacq} p_i^2(x)}$$

To determine which channels have to be selected for pre-combination and skipping, as criterium the $SNR_{Nrec}$ could be maximized. But it is better to maximize the 'information content'. This invention uses the 'information content' criterium, where $Q_{Nrec}$ is maximized.

$$Q_{Nrec} = \sum_x \ln(q_{Nrec}^2(x) + 1)$$

Reducing to the number of elements to $N_{rec}$ can be performed in many ways. The optimal method would calculate $Q_{Nrec}$ for every possible way to reduce the number of channels to $N_{rec}$. But this costs too much processing power.

A solution to this problem is given by reducing the number of channels by skipping a channel i. The quality is then reduced by $$\Delta Q_{skip\_i} = Q_{N-1} - Q_N = \sum_x \ln\left(\frac{q_N^2(x) - p_i^2(x) + 1}{q_N^2(x) + 1}\right)$$

Now combine the channels or skip the channel that leads to a minimal information loss. It can be easily seen that this process can be repeated until the number of elements is reduced to $N_{rec}$.

Figure 4:
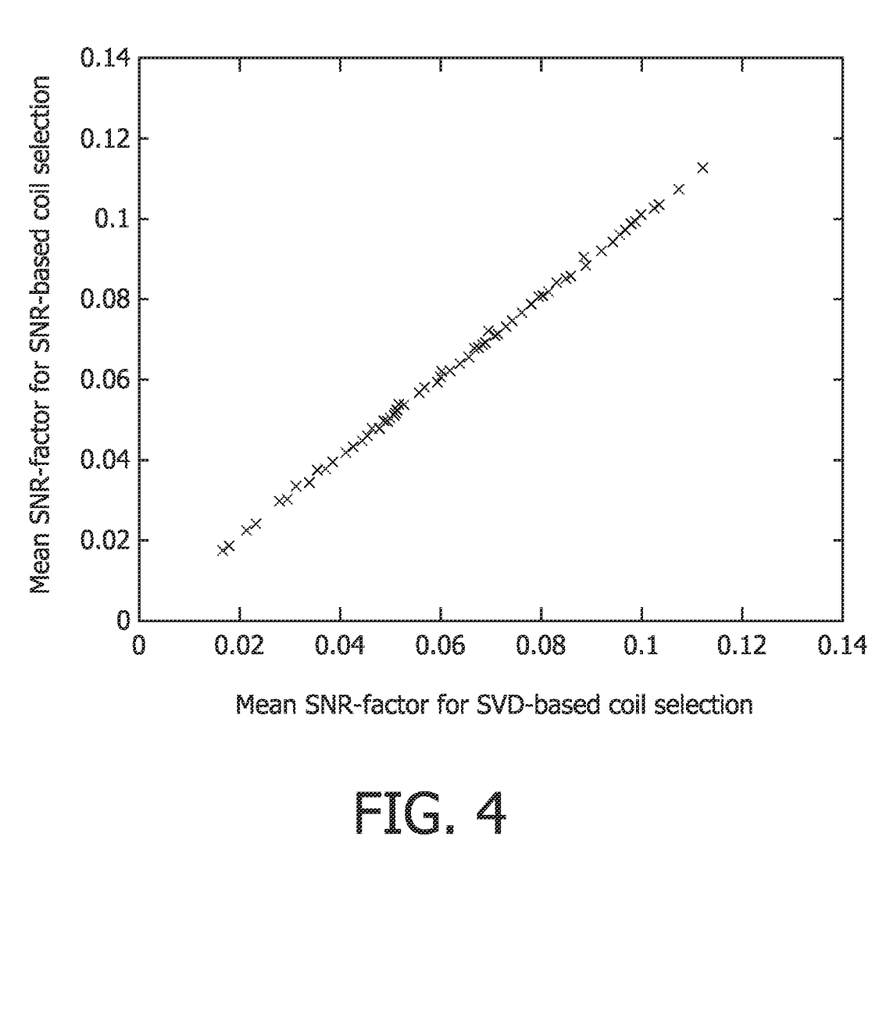
FIG. 4 shows a comparison between SVD-based and SNR (signal to noise ratio) based coil selection algorithms.

FIG. 4 shows a comparison between an SVD-based and SNR-based coil selection algorithm. The SNR-based coil selection algorithm is an algorithm which considers signal to noise ratios obtained when combining coils on a coil-by-coil basis. This algorithm has the disadvantage of being slow since all kinds of coil element combinations need to be 'individually considered.

FIG. 4 shows the scatter plot of the mean SNR-factor for the pixels that were used for coil selection. The mean SNR-factor is very well correlated between the two algorithms for 100 simulated data sets. For simulation, 100 different sets of computer generated coil sensitivity maps were used, while each set consisted of 32 coil elements. The coil array elements were modeled as circular coils with 40 mm radius. The coil element positions were randomly chosen within the area constrained by two coaxial cylinders, whereas their orientation was chosen tangentially to the cylinders. By using this approach simple wraparound coils were modeled.

Sensitivity maps were calculated using the Biot-Savart law for a 384×384 pixel matrix and FOV 384×384 mm² arranged as a plane, orthogonal to the cylinder axis. The radii of the cylinders were chosen to be r=271.5 and R=300 mm such that all coils lie outside the FOV. In the z-direction, the coil positions vary between −200 and +200 mm from the considered FOV.

The results of the simulation show that the SVD-based coil selection method gives comparable results to the SNR-based selection at greatly reduced computational complexity. Additionally, single coil set evaluation requires more calculations for the SNR-based coil selection than for the SVD-based selection, which leads to an even greater factor for the required computation times. The computation time for a 384× 384 matrix was evaluated on a Xion processor, CPU 2.4 GHz, 4 GByte memory. The time for the SVD-based coil selection was t=0.02 s, and the time for the SNR-based coil selection was t=16.3 s, which is far too long for this clinical practice. These results clearly show that the SVD-based coil selection method according to the invention can be applied even in real time clinical MR studies.

LIST OF REFERENCE NUMERALS 100 data processing system
102 screen
104 input device
106 memory
108 interface
110 processor
112 computer program product
114 data acquisition module
116 coil selection module
118 movable table
120 patient
122 main coil
124 shim coils
126 selection module
128 region of interest
130 coils
132 receiver/transmitter unit

The invention claimed is:

1. A method of selecting a set of coil elements from a multitude of physical coil elements comprised in a coil array for performing a magnetic resonance imaging scan of a region of interest, the method comprising:
determining a coil sensitivity matrix of the multitude of physical coil elements for the region of interest,
determining a projection matrix, the projection matrix projecting the sensitivity matrix of the multitude of physical coil elements onto a set of virtual coil elements,
determining from the projection matrix the contribution of each physical coil element of the multitude of physical coil elements to the set of virtual coil elements,
selecting from the contribution the most significantly contributing physical coil elements as the set of coil elements.

2. The method of claim 1, wherein the projection matrix is determined by factorization of the coil sensitivity matrix.

3. The method of claim 2, wherein the factorization is performed by singular value decomposition.

4. The method of claim 1, wherein the contribution of a physical coil element is determined by calculating the total of all projection matrix element magnitudes receiving a contribution from the physical coil element.

5. The method of claim 4, wherein the contribution of the physical coil element is the averaged contribution of said physical coil element to all voxels in the region of interest.

6. The method of claim 1, further comprising determining a noise correlation matrix of the multitude of physical coil elements, wherein the projection matrix is determined from the coil sensitivity matrix and the noise correlation matrix.

7. The method of claim 1, further comprising determining additional contributions of each physical coil element of the multitude of physical coil elements to the set of virtual coil elements using a noise correlation matrix, wherein the selection of the most significantly contributing physical coil elements as the set of coil elements further comprises weighting the contribution of each physical coil element according to the additional contributions derived from the noise correlation matrix.

8. The method of claim 7, wherein the additional contributions are calculated by means of a further projection matrix, wherein the further projection matrix is determined by factorization of the noise correlation matrix.

9. The method of claim 1, wherein the coil sensitivity matrix is a reception coil sensitivity matrix or a transmission coil sensitivity matrix.

10. A non-transitory computer-readable medium comprising computer executable instructions to perform operations comprising:
   determining a coil sensitivity matrix of the multitude of physical coil elements for a region of interest,
   determining a projection matrix, the projection matrix projecting the sensitivity matrix of the multitude of physical coil elements onto a set of virtual coil elements,
   determining from the projection matrix the contribution of each physical coil element of the multitude of physical coil elements to the set of virtual coil elements, and
   selecting from the contribution the most significantly contributing physical coil elements as a set of coil elements for performing a magnetic resonance imaging scan of the region of interest.

11. A magnetic resonance imaging system, the system comprising a coil array adapted for performing a magnetic resonance imaging scan of a region of interest, wherein the coil array comprises a multitude of physical coil elements, the system comprising:
   means for determining a coil sensitivity matrix of the multitude of physical coil elements for the region of interest,
   means for determining a projection matrix, the projection matrix projecting the sensitivity matrix of the multitude of physical coil elements onto a set of virtual coil elements,
   means for determining from the projection matrix the contribution of each physical coil element of the multitude of physical coil elements to the set of virtual coil elements,
   means for selecting from the contribution the most significantly contributing physical coil elements as a set of coil elements applicable for performing a magnetic resonance imaging scan of the region of interest.

* * * * *